United States Patent [19]
Ohtsuki et al.

[11] Patent Number: 5,483,097
[45] Date of Patent: Jan. 9, 1996

[54] DEVICE PROTECTING LAYER

[75] Inventors: Hiroshi Ohtsuki, Kasugai; Fumio Ohara, Okazaki; Shoji Toyoshima, Kohnan, all of Japan

[73] Assignee: Nippondenso Co., Ltd., Kariya, Japan

[21] Appl. No.: 181,111

[22] Filed: Jan. 13, 1994

[30] Foreign Application Priority Data

Jan. 14, 1992 [JP] Japan .................................. 5-021821
Dec. 1, 1993 [JP] Japan .................................. 5-338849

[51] Int. Cl.$^6$ .................................................. H01L 29/34
[52] U.S. Cl. .......................... 257/632; 257/640; 257/649
[58] Field of Search .................................... 257/632, 640, 257/649; 437/241

[56] References Cited

FOREIGN PATENT DOCUMENTS

| | | |
|---|---|---|
| 60-21531 | 2/1985 | Japan . |
| 62-501600 | 6/1987 | Japan . |
| 63-53703 | 10/1988 | Japan . |
| 1134935 | 5/1989 | Japan . |
| 2162773 | 6/1990 | Japan . |
| 3129734 | 6/1991 | Japan . |

OTHER PUBLICATIONS

Y. Yasuda: "Plasma CVD Technology and its Applications", Apply. Phys. vol. 50, No. 6, 1981, pp. 638–649 See Appla pp. 1 & 2.

S. Fujita et al: "Recent Research and Development on Silicon Nitride Thin Films", Appl. Phys. vol. 54, No. 12, 1985, pp. 1250–1266.

M. Rand et al: Journal of Electrochemical Society: "Solid–state Science and Technology", vol. 125, No. 1, Jan. 1978, pp. 99–101, Optical Absorption as a Control Test for Plasma Silicon Nitride Deposition.

H. J. Stein et al: J. Electrochem. Soc.: Solid–state Science and Technology vol. 126, No. 10, Oct. 1979 pp. 1750–1753, "Properties of Plasma–Deposited Silicon Nitride".

J. Robertson et al: Appl. Phys Lett. 44 (4), Feb. 15, 1984 pp. 415–416. "Gap States in Silicon Nitride".

W. Warren et al: J. Electrochem. Soc., Nol. 139, No. 3, Mar. 1992, pp. 880–889, "Paramagnetic Point Defects in Amorphous Silicon Dioxide and Amorphous Silicon Nitride Thin Films".

W. Lanford: J. Appln Phys. 49 (4), Apr. 1978, pp. 2473–2477, "The Hydrogen content of plasma–deposited silicon nitride".

E. Bustarret et al: Phusical Review B, vol. 38, No. 12, Oct. 15, 1988, pp. 8171–8184 "Configurational statistics in a–SixNyHz alloys: A quantitive bonding analysis".

A. Shinha et al: J. Electrochem. Soc: "Solid–state Science and Technology", vol. 125, No. 4, Apr. 1978, pp. 601–608, Reactive Plasma Deposited Si–N Films for MOS–LSI Passivation.

Primary Examiner—Sara W. Crane
Attorney, Agent, or Firm—Cushman, Darby & Cushman

[57] ABSTRACT

A device protecting film having a UV transmissible SiN film, wherein the film is formed by a plasma CVD process in such a manner that a composition ratio Si/N falls within the range of 0.75 to 0.87, a Si—H bond concentration Z (cm$^{-3}$) in the SiN film has a value near the value Z expressed by the following formula in accordance with a value X of Si/N:

$$Z = 1.58 \times 10^{22} X - 9.94 \times 10^{21}$$

and, at the same time, a hydrogen bond concentration Y (cm$^{-3}$) determining the Si—H bond concentration has a value near the value Y expressed by the following formula in accordance with X:

$$Y = 1.01 \times 10^{22} X + 0.54 \times 10^{22}$$

The resulting SiN film transmits ultraviolet rays having a wavelength of 254 nm, reduces a stress inside the film, and has high moisture resistance.

7 Claims, 10 Drawing Sheets

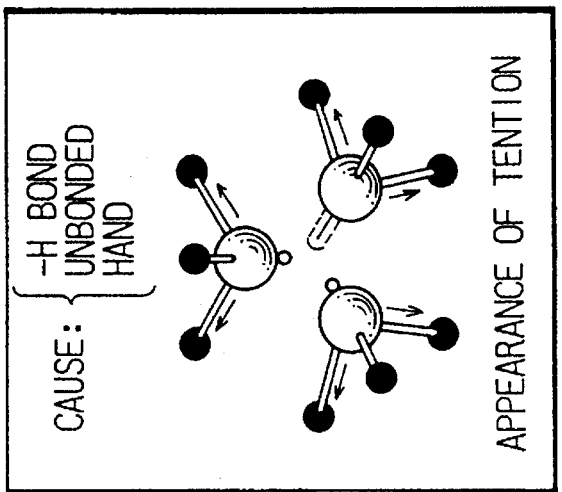
Fig. 3A  Si₃N₄ BOND
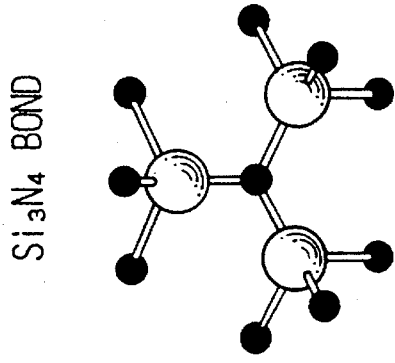
Fig. 3B  CAUSE: Si-Si BOND / APPEARANCE OF SHRINKAGE
Fig. 3C  CAUSE: -H BOND UNBONDED HAND / APPEARANCE OF TENTION
Fig. 3D
| BOND | BOND LENGTH |
|---|---|
| Si – Si | 2.35 Å |
| Si – N | 1.72 |
| Si – H | 1.48 |
| N – H | 1.01 |
○ Si  ● N  ○ H  ◐ UNBONDED HAND

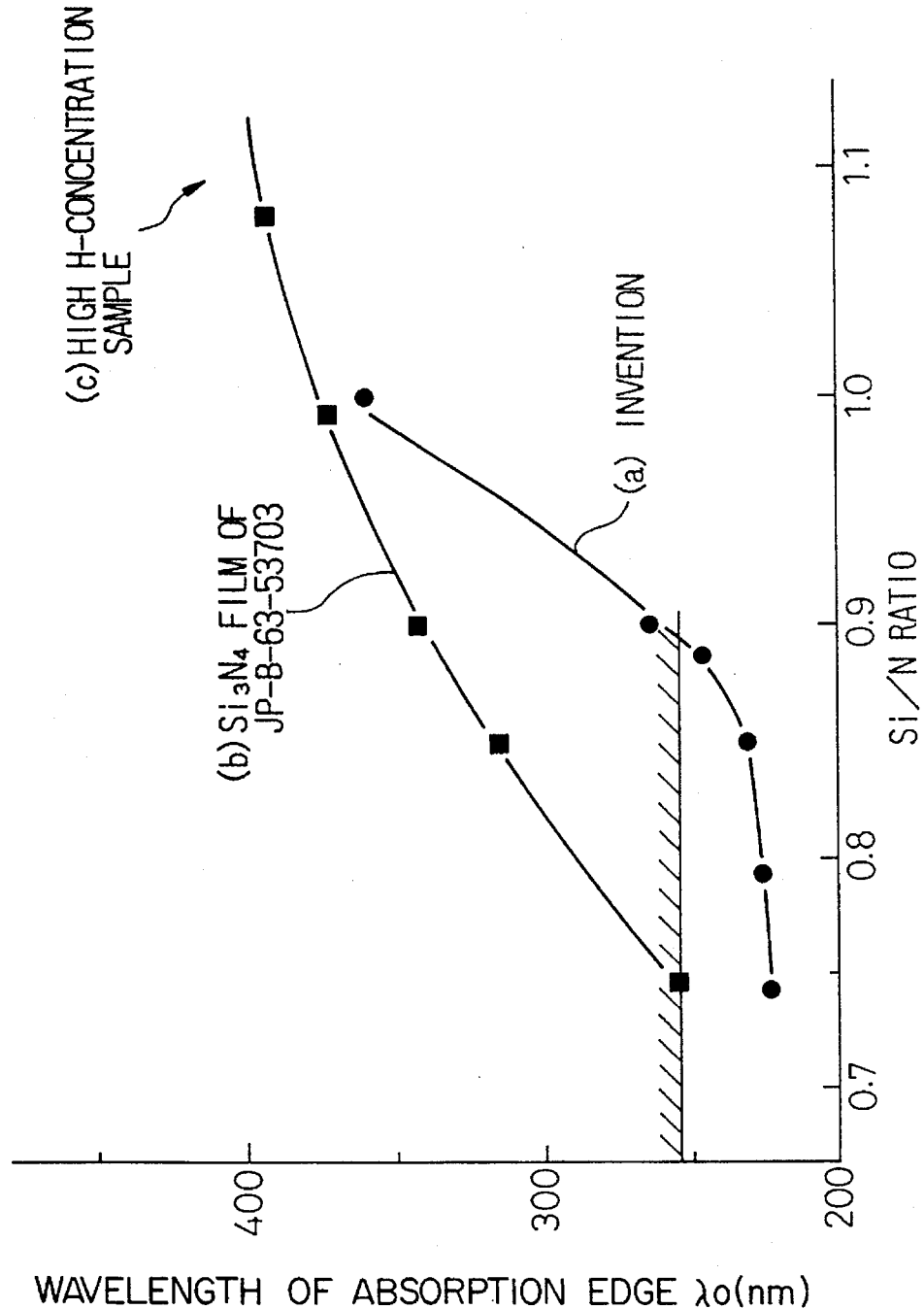

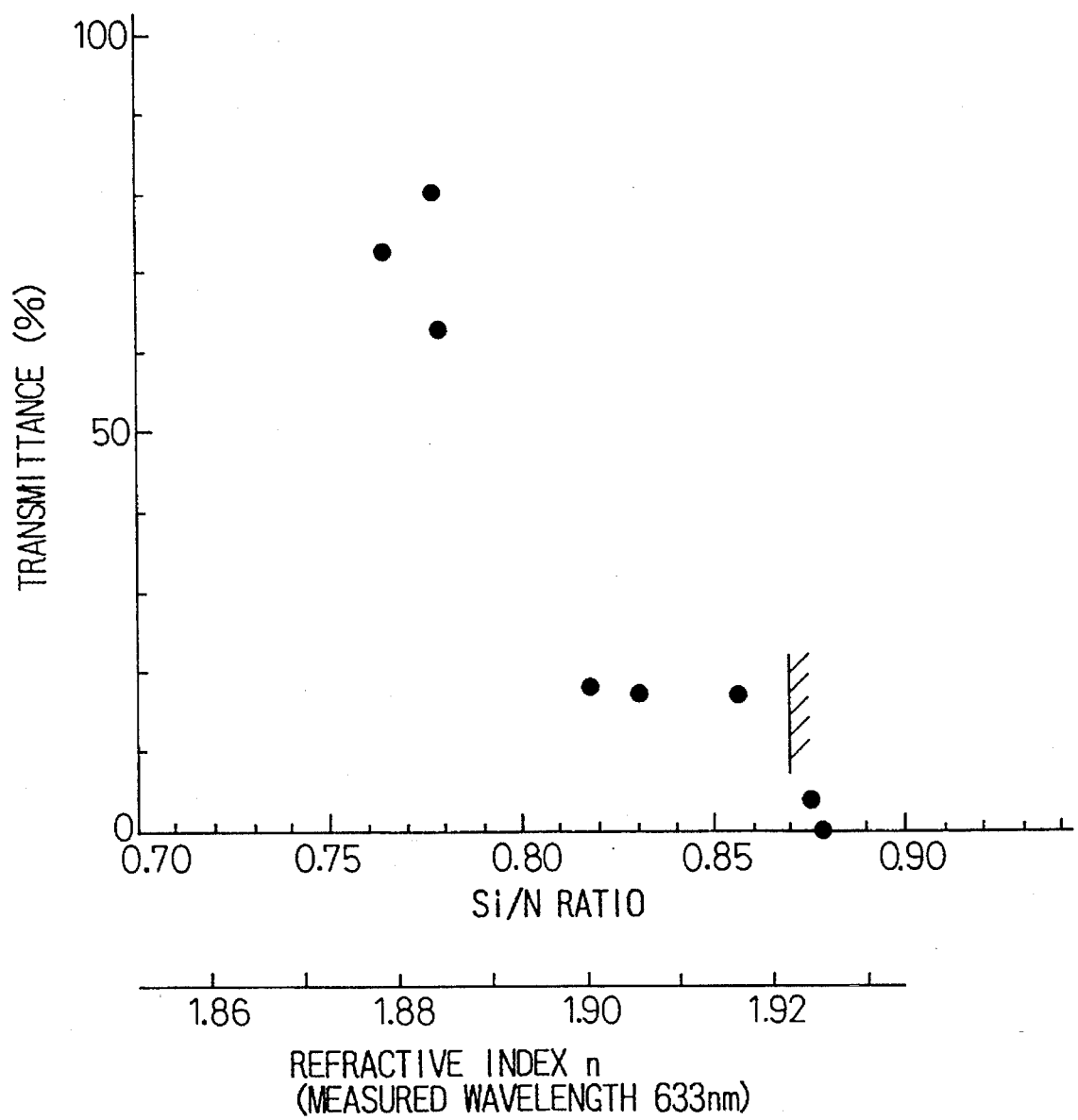

EXCESS N (Si/N<0.75)

N-N BOND: NOT FORMED

COARSE NETWORK

○ Si
● N
○ H

EXCESS Si (Si/N>0.75)

Si-Si BOND: FORMED

DENSE NETWORK

DEVICE PROTECTING LAYER

BACKGROUND OF THE INVENTION

1. Field of the Invention

This invention relates to a protecting film for a semiconductor device or the like which must transmit ultraviolet rays (UV). More particularly, the present invention relates to a protecting film for a UV-erasable ROM.

2. Description of the Related Art

A silicon nitride film (hereinafter referred to as an "SiN film") has been used in the past as a protecting film for a UV-curable type ROM. This is because the SiN film can be formed at a temperature below 450° C. by a plasma CVD process and the reaction between an Al wiring and a Si substrate can be restricted. Recently, the improvement of characteristics of this protecting film has been pursued. The SiN film is formed by rendering a reactive gas plasma. Japanese Examined Patent Publication (Kokoku) No. 63-53703 stipulates a composition ratio composition ratio SiN in a SiN film to be from 0.065 to 0.825 when creating a SiN film. This reference reports that when the Si/N composition is within this range, the SiN film is transparent to ultraviolet rays having a wavelength of 300 nm or less. When the Si/N composition is below 0.65, the chemical property of the film becomes deteriorated and when it is greater than 0.825, the film does not transmit ultraviolet rays.

In practice, however, the wavelength of the ultraviolet rays used for erasure in UV-erasable type ROMs is about 254 nm. Japanese Unexamined Patent Publication (Kokai) No. 2-162773 describes that the composition ratio Si/N must be not greater than 0.75 in order for the film to transmit the 254 nm ultraviolet rays.

At the same time, Japanese Unexamined Patent Publication (Kokai) No. 3-129734 points out the difficulty in which an SiN film having the composition ratio Si/N within the range of 0.65 to 0.825 exerts a great stress on the base. Accordingly, this prior art reference is characterized in that the SiN film is not directly formed on the base but is deposited on the base with another insulating layer therebetween.

On the other hand, "Plasma CVD Technology and Its Application" (Applied Physics (Oyo Butsuri), Vol. 50, No. 6, pp. 638–649, 1981) described as follows:

"The plasma CVD film is generally under a non-equilibrium state and has a great internal stress. This internal stress greatly changes depending on the film growth conditions, that is, the SiN ratio and the hydrogen atom (H) concentration. When viewed collectively, however, the factor that affects the internal stress is not the SiN ratio but is rather the concentration of the hydrogen atom, and the compressive stress increases with the decrease of the hydrogen atom concentration."

The literature mentioned above ("Plasma CVD Technology and Its Application") illustrates the relationship between the Si/N ratio and an absorption edge wavelength $\lambda_0$ in its FIG. 7 and shows a content sample having a high H concentration. It can be understood from this drawing that when the hydrogen content is great even at the same Si/N ratio, the absorption edge wavelength increases. Though the compressive stress can be reduced by increasing the hydrogen atom content, adverse influences are invited with respect to UV transmission. It can be concluded, therefore, that a protecting film which can be used alone as a protecting film for an UV-erasable type ROM does not exist.

SUMMARY OF THE INVENTION

The inventors studied the Si—H bonds among the hydrogen bonds that are contained at the time of the formation of the SiN film and found that the Si—H bonds do not absorb ultraviolet rays. Accordingly, the present invention aims at providing a protecting film capable of transmitting ultraviolet rays and also capable of reducing the internal stress of the film by utilizing this characteristic of Si—H bonds.

To accomplish the object described above, the present invention provides a device protecting film made of hydrogen-containing silicon nitride, wherein a concentration Y ($cm^{-3}$) of the bonded hydrogen with respect to a value X of a ratio Si/N of silicon to nitrogen as the constituent elements of the silicon nitride satisfies the following formula (I), and in the bonded hydrogen concentration ($cm^{-3}$) described above, a bonded hydrogen concentration Z ($cm^{-3}$) between silicon and hydrogen with respect to the Si/N ratio X described above satisfies the following formula (II):

$$1.01 \times 10^{22} X + \alpha < Y < 1.01 \times 10^{22} X + \beta \quad \text{(I)}$$

$$1.58 \times 10^{22} X - \gamma < Z < 1.58 \times 10^{22} - \delta \quad \text{(II)}$$

In the device protecting film according to the present invention, hydrogen bonds are contained in the Si/N film in an amount within a range expressed by the formula (I) and the Si—H bonds are contained in an amount within the range expressed by the formula (II). Accordingly, the SiN film has a low stress of up to 150 MPa and does not absorb ultraviolet rays of about 254 nm. In other words, the present invention can provide a device protecting film having a low stress and capable of transmitting ultraviolet rays.

Transmittance of the ultraviolet rays of at least 10% can be secured by limiting the Si/N ratio to not greater than 0.87.

Moisture resistance can be improved by setting the Si/N ratio to not lower than 0.75.

In other words, since the total hydrogen content with respect to the Si/N ratio in the Si/N film is limited according to the present invention, it becomes possible for the first time to realize a UV-transmissible device protecting film which has high moisture resistance and a low stress.

BRIEF DESCRIPTION OF THE DRAWINGS

FIGS. 3A, 3B, and 3C are schematic views showing molecular models of the bonds contained in the SiN film;

FIG. 3D is a table showing each bond length contained in the SiN film;

FIG. 7 is a diagram showing the difference of wavelengths of an absorption edge between the present invention and the prior art;

FIG. 8 is a diagram showing the transmittance of the SiN film for 254 nm ultraviolet rays in contrast with an SiN ratio;

DESCRIPTION OF THE PREFERRED EMBODIMENTS

Figure 1:
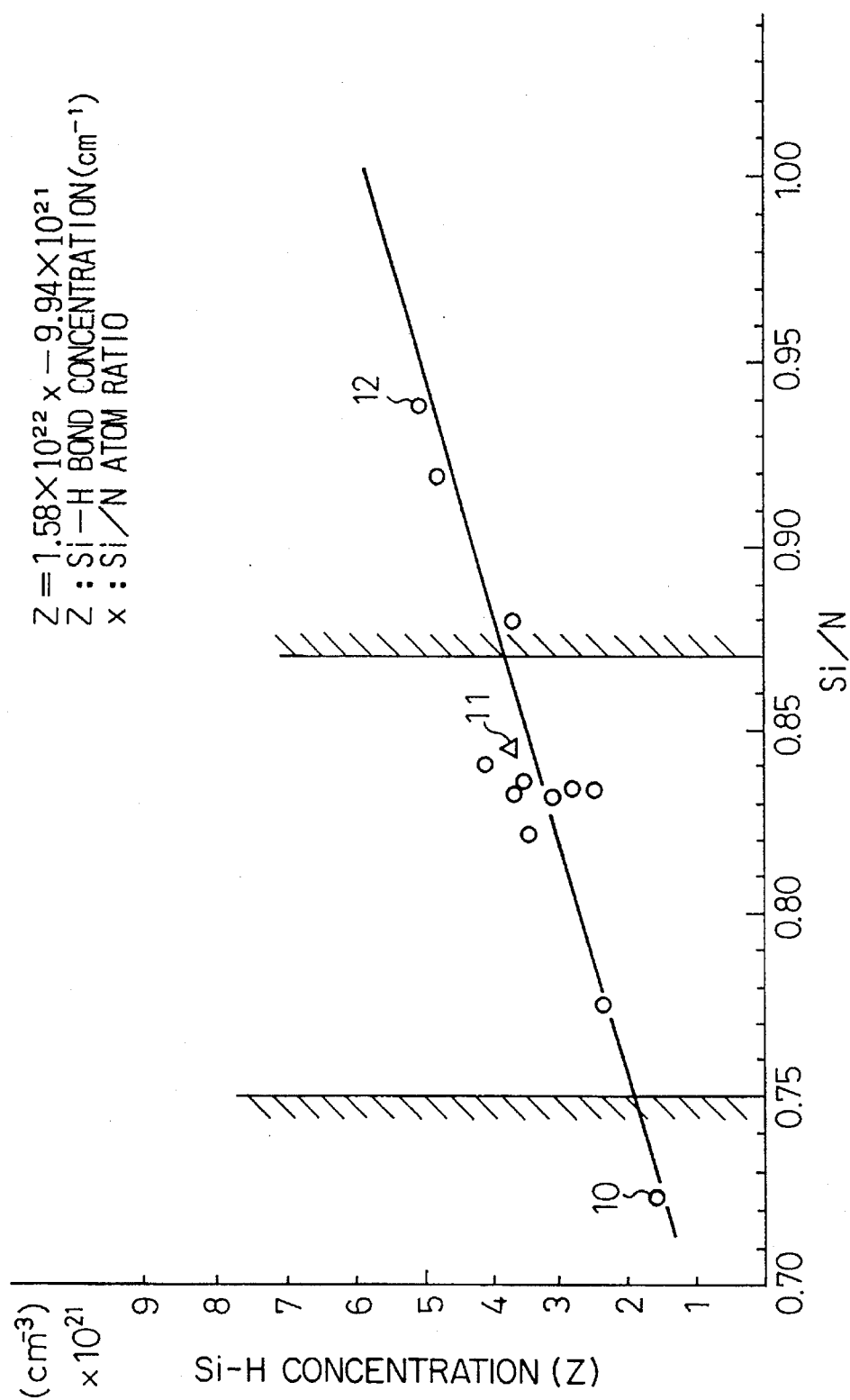
FIG. 1 is a diagram showing the range of an Si—H bond/component of an SiN film according to the present invention.
Figure 2:
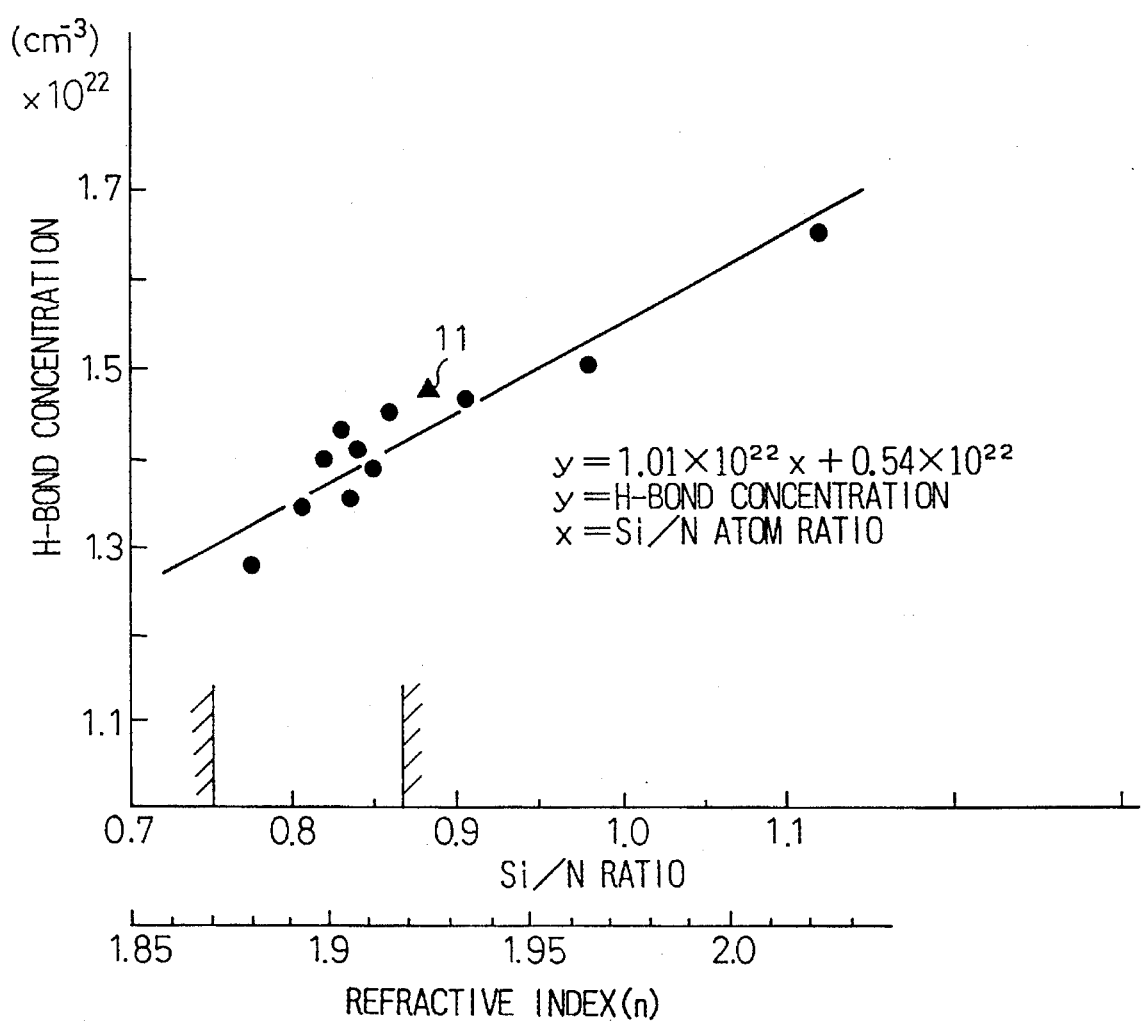
FIG. 2 is a diagram showing the range of the H bond/component of the SiN film according to the present invention.

Hereinafter, the formation of an SiN film as a final protecting film to be formed on a semiconductor device such as an EPROM will be described as an embodiment of the present invention. The SiN film formed by a plasma CVD process is amorphous silicon nitride containing hydrogen. Therefore, this film will be expressed as an "a-SiN:H film". An ordinary RF plasma CVD apparatus, which is a vacuum vessel having parallel plate electrodes (planer electrodes), is used as the apparatus for forming this a-SiN:H film. The film formation is carried out using this apparatus by combining a reaction gas $SiH_4/NH_3/N_2$=(75 to 150)/(50 to 100)/4500 (SCCM), a radio frequency (RF) power for causing plasma of 250 to 420 W at a temperature of 250° to 420° C. under a pressure of 4.0 to 7.0 Torr so as to obtain a predetermined Si/N composition ratio. FIG. 1 shows sample points 10 to 12 when the formation is carried out under the following film conditions:

(The data obtained when the film is formed at a reaction gas $SiH_4/NH_3/N_2$=75/50/4500 (SCCM), power of 290 W, temperature of 360° C., pressure of 5.0 Torr and distance between electrodes of 380 mils is presented by a triangle 11 in FIGS. 1 and 2.)

regression line from these data is expressed by the following formula (I') (correlational coefficient =0.95, number of samples=approx. 40):

$$Y=1.01\times10^{22}X+0.54\times10^{22}\pm K_1 \quad (I')$$

where

Y: bond concentration of hydrogen,

S: Si/N ratio, $K_1$: tolerance.

Figure 4:
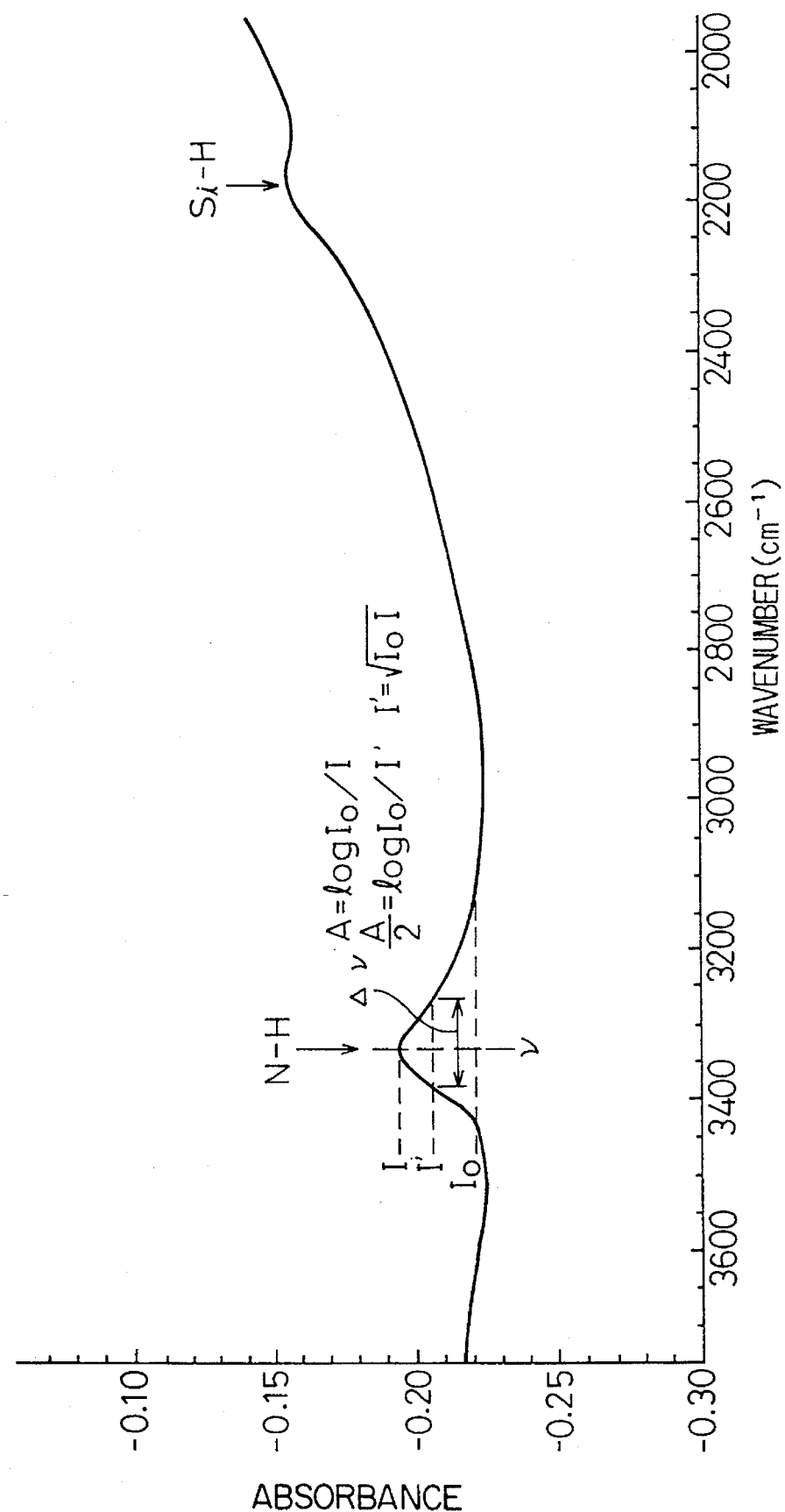
FIG. 4 is a data chart of an infrared absorption spectrum showing the measurement result of the H bond concentration in the SiN film.

The film stress is obtained by forming the a-SiN:H film on a Si substrate and measuring the warping of the Si substrate before and after the film formation. The hydrogen bond concentration is calculated by quantitative determination of the infrared absorption spectra (FT-IR method; see FIG. 4). This determination can be made in accordance with the method proposed by W. A. Lanford et al. ("J. Appl. Phys." Vol. 49, No. 4, (1978), p. 2473):

$$\text{H bond concentration (cm}^{-3}) = \quad (III)$$

$$(1.4 \times (\text{signal value } A \text{ of N—H bond} \times$$

$$\text{half maximum width } \Delta v) +$$

$$(\text{signal value of Si—H bond} \times \text{half maximum width}) -$$

$$1.63)/(K \times \text{film thickness (cm)})$$

where K: conversion coefficient, which is $6.62\times10^{-18}$ (cm).

| | | | Film formation condition | | | | |
|---|---|---|---|---|---|---|---|
| Sample No | Si/N | Si—H concentration (°C.) | Temp. (°C.) | Pressure (Torr) | RF power (W) | Gas flow rate (SCCM) | Distance between electrode (mils) |
| 10 | 0.724 | $1.55 \times 10^{21}$ | 250 | 6.6 | 360 | $SiH_4/NH_3/N_2$ = 75/50/4500 | 380 |
| 11 | 0.844 | $3.67 \times 10^{21}$ | 360 | 5.0 | 290 | Same as above | Same as above |
| 12 | 0.939 | $5.04 \times 10^{21}$ | 360 | 5.0 | 300 | Same as above | Same as above |

In connection with the formation of a low stress film, FIG. 2 shows a hydrogen bond concentration (H bond concentration) with respect to a Si/N composition ratio for films having a compressive stress of 0 to 100 MPa among the a-Si/N:H films formed under the film conditions tabulated above. The mechanism which brings forth the low stress will be explained with reference to molecular bond models of FIGS. 3A, 3B, and 3C. Each bond length contained in the SiN film is shown in FIG. 3D. It is believed that when an Si—Si bond having a great bond length is contained in the Si—N bond as the basic bond of the SiN film, compressive stress acts on the peripheral portion by that extent (see FIG. 3B). In the case of a hydrogen bond having a small bond length, on the contrary, the bond is terminated by hydrogen and a mutual bond network is not formed. Accordingly, the balance with the peripheral portion collapses, so that tensile stress is believed to occur (see FIG. 3C). In an SiN film having a SiN composition ratio with excessive Si, a suitable concentration of the hydrogen bonds which generate the tensile stress may be contained so as to offset the Si—Si bonds which generate the compressive stress.

As can be understood from FIG. 2, films having the low stress are substantially aligned on a straight line, and a Here, the value A is a logarithm of the ratio of the intensity $I_0$ of the base line of the signal obtained from the N—H and Si—H bonds to the signal peak value I and can be expressed as follows:

$$A=\log (I_0/I) \quad (IV)$$

This value A represents a true signal value. The half maximum width $\Delta v$ represents the width when the signal peak expressed by the following formula decreases to half:

$$I'=(I_0 \cdot I)^{1/2} \quad (V)$$

Accordingly, the formula (III) corresponds to the calculation of the area of the signal peak. This is because the signal area is believed to be proportional to the hydrogen bond concentration. As to the Si—H bonds, too, the hydrogen bond concentration is obtained by similarly applying the formula (III).

FIG. 2 shows the axis of the refractive index at a measurement wavelength of 633 nm in proportion to the Si/N composition ratio. This is because strict measurement of the Si/N composition ratio requires expensive measuring equipment. Several main data points are precisely measured and the rest are plotted utilizing the fact that the Si/N composition ratio is substantially proportional to the refractive index.

It is said that if the SiN film is given compressive stress to prevent the occurrence of cracks in the SiN film itself, micro wirings of the semiconductor device are likely to break due to stress migration. This is not desirable from the viewpoint reliability of the device. Experiments reveal that reliability of the wirings can be easily maintained when the compressive stress of the SiN film is not more than 150 MPa and, preferably, below 100 MPa.

Figure 5:
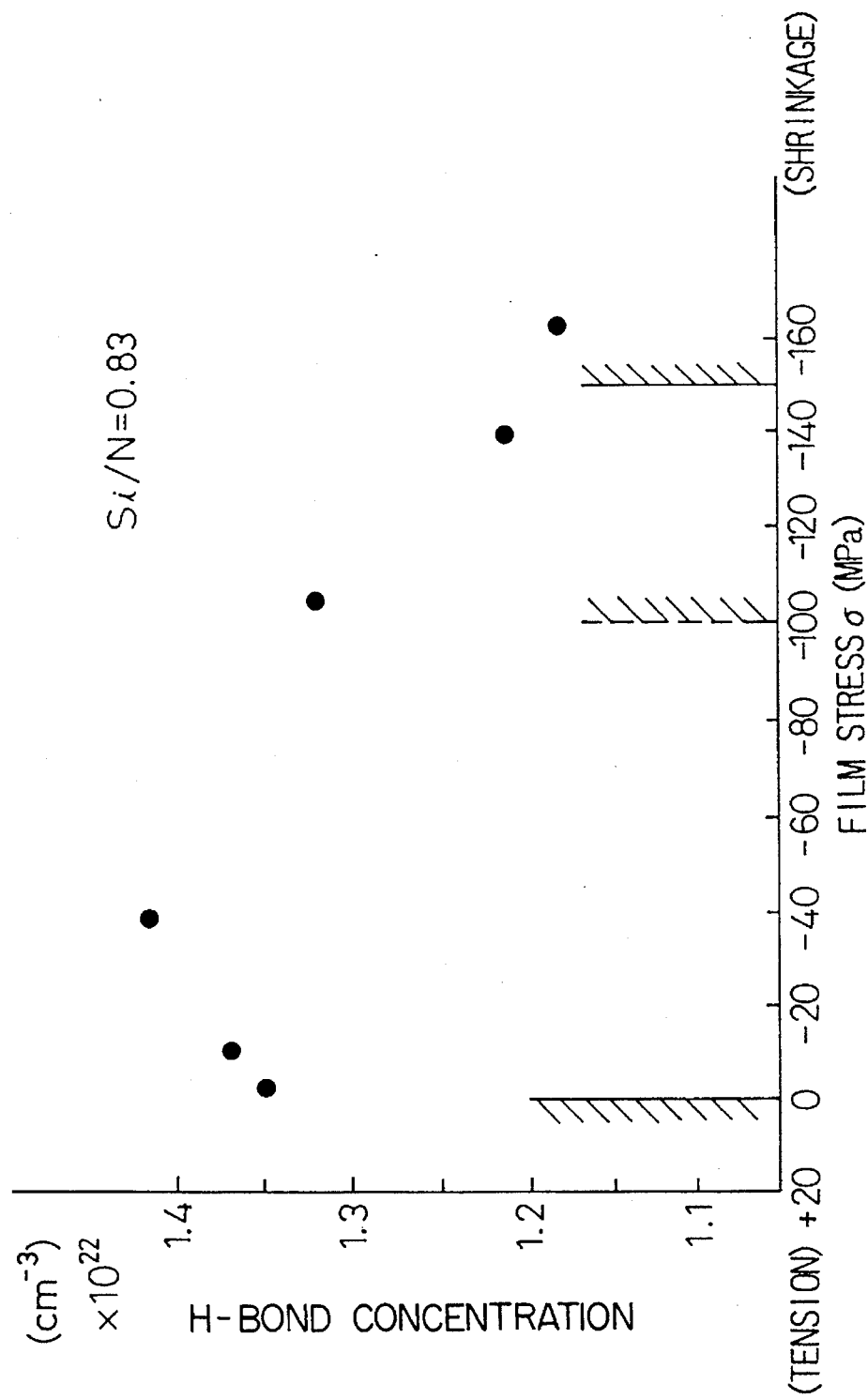
FIG. 5 is a distribution chart showing tolerance of the component range shown in FIG. 2.

The hydrogen content was calculated in relation to the film stress for film having an Si/N composition ratio of 0.83 and having a compressive stress of up to 100 MPa among the SiN films described above. The result is shown in FIG. 5. The distribution of the hydrogen content in this case substantially falls within the range of 1.33 to $1.42 \times 10^{22}$ cm$^{-3}$. This value represents the degree of the tolerance $K_1$ for the value $1.38 \times 10^{22}$ cm$^{-3}$ when X =0.83 in the regression line of the formula (I'). Accordingly, the hydrogen bond concentration Y is not limited to a value on the regression line. When the stress below 150 lMPa is permitted, the tolerance $K_1$ becomes greater.

The present inventors have clarified that when the concentration of the Si—H bonds in the H bond concentration is adjusted at the time of the formation of the SiN film, the absorption edge of the ultraviolet rays changes and the film transmits ultraviolet rays having a wavelength smaller than the wavelength 254 nm. FIG. 1 shows the measurement result of the Si—H bond concentration for a-SiN:H films permitting the transmission of the desired wavelengths at each Si/N composition ratio. Quantitative determination of the Si—H bonds is performed in accordance with the formula (III) when the H bond concentration is determined. As is obvious from FIG. 1, the films satisfying the requirement are aligned substantially in the vicinity of the line. When a regression line is determined on the basis of these data, the following formula (II') can be obtained (correlational coefficient=0.90, number of samples=approx. 20):

$$Z=1.58 \times 10^{22} X - 9.94 \times 10^{21} \pm K_2 \quad (II')$$

where

Z: Si—H bond concentration,

X: Si/N ratio, $K_2$: tolerance.

In this case, too, the H bond concentration is not limited to the values on the regression line in the same way as in the case of the regression line of the formula (I'), but has the tolerance $K_2$ of an extent represented by the data points in FIG. 1.

Accordingly, it can be understood that a protecting film of a semiconductor device having a low stress and UV transmissibility can be obtained by constituting the a-SiN:H film in such a manner as to satisfy the conditions expressed by the regression lines (I') and (II').

Among the H bonds, the Si—H bond concentration can be adjusted by lowering the RF power at the time of formation of the film to increase the Si—H bonds and to decrease the N—H bonds. When the RF power is increased at the time of the film formation, on the contrary, the Si—H bonds can be decreased while the N—H bonds can be increased.

Next, the principle which provides an SiN film having a low stress and UV transmissibility by stipulating the hydrogen bond concentration with respect to the Si/N ratio will be explained.

Figure 6:
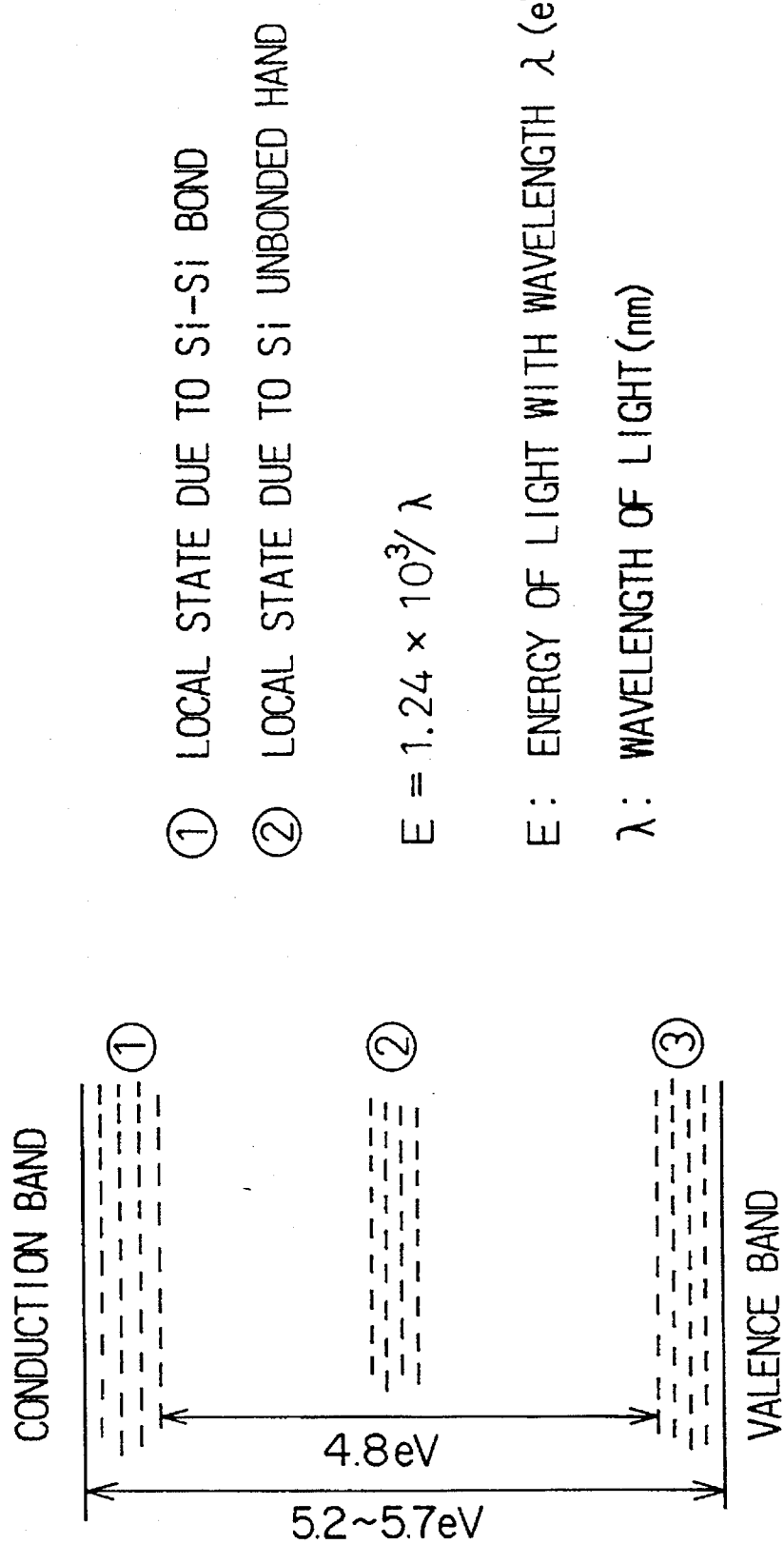
FIG. 6 is a schematic view of a band structure of a silicon nitride film.

The a-SiN:H film in the present invention is originally based on the Si—N bonds. These bonds transmit ultraviolet rays having a wavelength of 238 nm corresponding to the band gap of 5.2 eV of SiN. This film sufficiently transmits the required wavelength of 254 nm. However, the existence of the Si—Si bonds and the unbonded Si hands forms the local level upon absorption of the ultraviolet rays, reduces the energy gap as in the band structure shown in FIG. 6, and shifts the absorption edge wavelength towards longer wavelengths. Accordingly, the required ultraviolet wavelength of 254 nm (4.9 eV) is absorbed and the film becomes opaque. However, since other Si—H bonds and the N—H bonds do not form the local level inside the band gap, such absorption does not occur and the required ultraviolet ray passes through. For this reason, even a film containing Si in excess or in other words, a film having a high Si/N composition ratio, can transmit ultraviolet rays having the object wavelength by increasing the Si—H bond concentration and thus decreasing the presence of the Si—Si bonds and the Si unbonded hands. Incidentally, the concentration of the existing Si unbonded hands is preferably below $10^{17}$ cm$^{-3}$.

FIG. 7 shows the result of measurement of the light absorption edge wavelength for each Si/N ratio of the SiN film according to the present invention. As an example, the result of the prior art example is also shown. The product of the present invention obviously has improved transmission efficiency of the ultraviolet rays. It can be understood that the present invention has sufficient transmissibility of light having a wavelength of 254 nm at the Si/N ratio of 0.75 or more. Note that, the range of the Si/N ratio of at least 0.75 stipulated thereby results from the later-appearing moisture resistance, and the Si/N ratio is not always limited to at least 0.75 in conjunction with the light absorption edge wavelength. In the present invention, the Si/N ratio by which the absorption edge wavelength attains 254 nm is about 0.89. In order to erase data by irradiation of ultraviolet rays having the wavelength of 254 nm within a permissible time, however, the value of the Si/N ratio is preferably smaller.

The device protecting film is used preferably at a thickness of at least about 1 μm. FIG. 8 shows the transmittance of light having a wavelength of 254 nm at each Si/N ratio when the film is formed to a thickness of 1.6 μm. To complete data erasure within a practical time, transmittance of at least 10% is necessary (the time necessary for erasure at this time is within one hour). From this viewpoint, the Si/N ratio is preferably limited to not more than 0.87 in practice.

Note that the Si—N bonds serving as the basic bonds, the Si—Si bonds, the Si—H bonds, and the N—H bonds exist inside the SiN film. Among them, one each Si—H bond and Si—N bond can be replaced by one N—H bond as illustrated below. This is because the SiN film is amorphous, and these bonds are originally disposed at random.

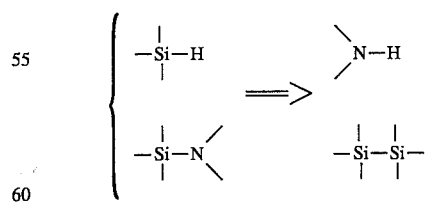

At this time, the overall Si/N ratio and the overall hydrogen bond concentration remain the same. However, in the film after the N—H bonds are replaced, Si—Si bonds which absorb ultraviolet rays are formed. For this reason, this film has a lower UV transmittance than the former film consisting of the Si—H bonds and the Si—N bonds. Accordingly, sufficient UV transmittance characteristics cannot be obtained unless the Si—H bond concentration in the Si/N film is secured in addition to the stipulation of the hydrogen bond concentration with respect to the Si/N ratio.

As shown in FIG. 8, while transmittance of at least 10% can be secured at an Si/N ratio of up to 0.87, it becomes less than 10% at an Si/N ratio within a range where the Si/N is greater than 0.87. This is not preferable in a device protecting film for a UV-transmissible type semiconductor device. Therefore, from the experimental results shown in FIG. 8, a device protecting film capable of sufficiently transmitting ultraviolet rays can be obtained by setting the Si/N ratio to the range less than or equal to 0.87.

When using the device protecting film for a semiconductor device for an automobile, an improvement in moisture resistance is necessary because the device is used under stringent conditions.

In connection with the moisture resistance of the device protecting film, it is known that the lower the Si/N composition, the lower the moisture resistance. Japanese Unexamined Patent Publication (Kokai) No. 60-21531, for example, teaches that moisture resistance can be secured by a plasma SiN film having an absorption edge wavelength of at least 260 nm. When the Si/N ratio of this film is estimated from the relation (line shown in FIG. 7(b)) between the Si/N ratio and the light absorption edge wavelength described in Japanese Examined Patent Publication (Kokoku) No. 63-53703, the Si/N ratio is found to be greater than 0.75.

Figure 9B:
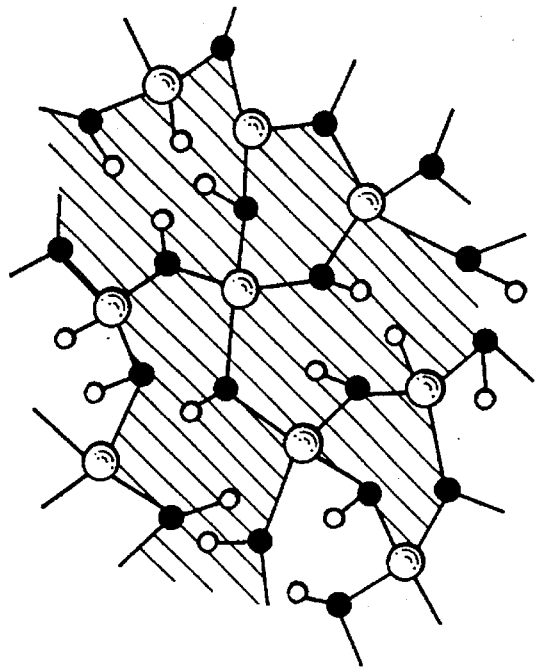
FIGS. 9A and 9B are explanatory views each useful for explaining moisture resistance with respect to the Si/N ratio.
Figure 9A:
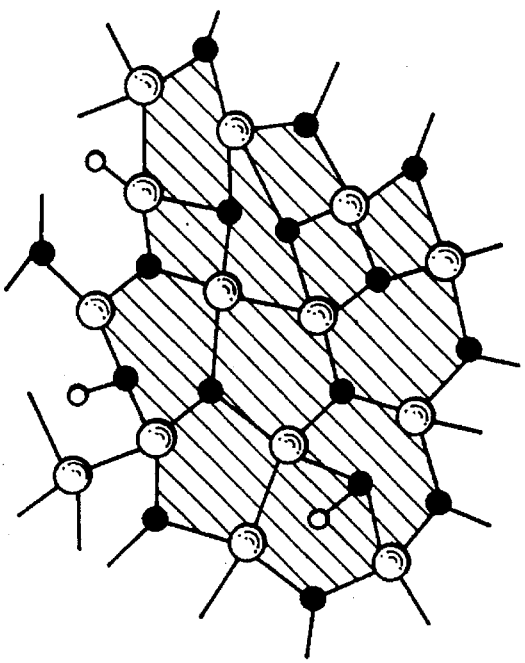

Nitrogen (N) becomes excessive when the Si/N ratio becomes smaller than 0.75 as shown in FIGS. 9A and 9B. In this case, since the N—N bonds cannot exist stably inside the film due to the relation of the bond orbits, the network constituting the film becomes coarse. For this reason, when the Si/N becomes smaller than 0.75, the moisture resistance drastically drops. Therefore, an Si/N ratio of at least 0.75 is essential in order to secure the moisture resistance.

Figure 10:
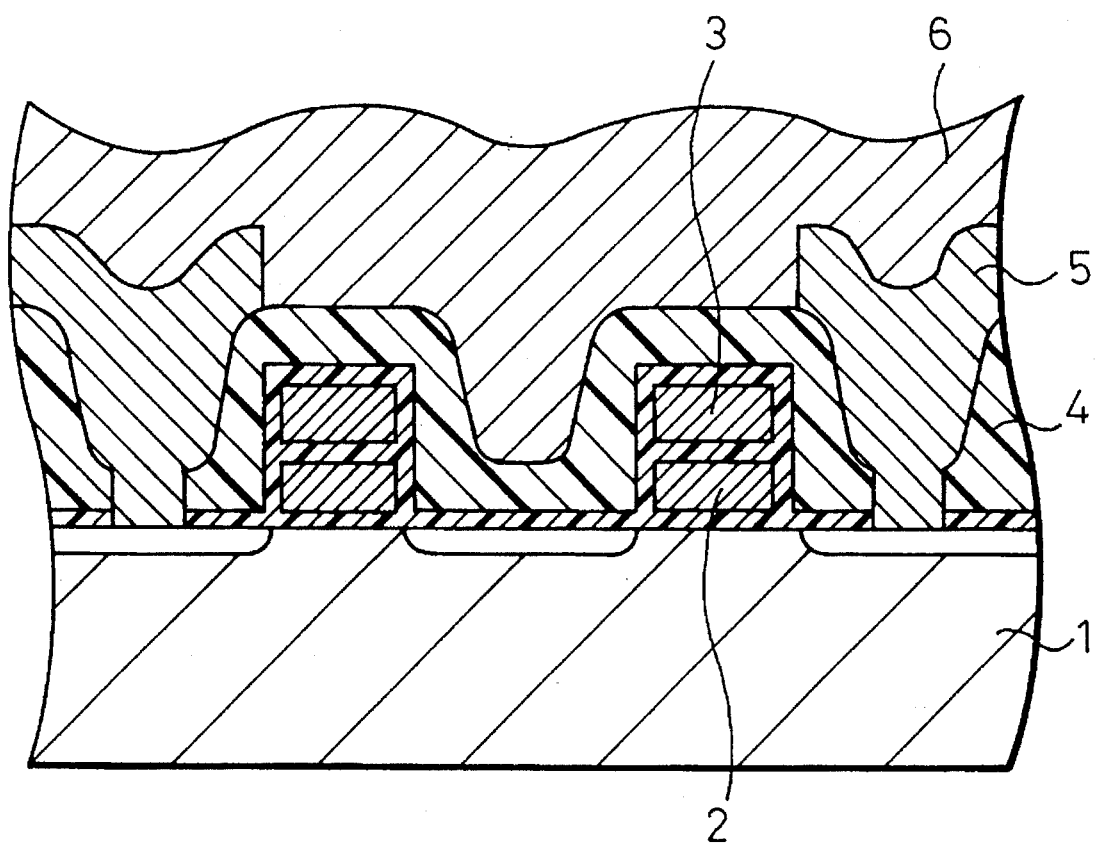
FIG. 10 is a schematic sectional view of an EPROM fabricated by applying the present invention.

FIG. 10 is a schematic sectional view of an EPROM to which the present invention is applied. A floating gate 2 and a control gate 3 are formed on a Si substrate 1 and are protected by an interlayer insulating film 4. Further, an Al wiring 5 is deposited, and the SiN film 6 of the present invention as the final protective film is formed on this Al wiring 5. When a charge is built up in the floating gate 2, the EPROM enters the memory state. When ultraviolet rays having a wavelength of about 254 nm are irradiated through the SiN film 6, the charge is emitted and the memory state is released.

When the a-SiN:H film is formed as the final protecting film 6, the desired UV-transmissible SiN film having a low stress and high moisture resistance can be obtained by causing the film to contain hydrogen in the concentration expressed by the formulas (I') and (II') or setting the Si/N composition ratio to the range of from 0.75 to 0.87. Accordingly, the SiN film 6 can be directly formed on the Al wiring 5 as shown in FIG. 10.

We claim:

1. A device protecting film made of hydrogen-containing silicon nitride, wherein a hydrogen bond concentration Y ($cm^{-3}$) and a ratio Si/N of silicon to nitrogen, X satisfy the following formula:

$$1.01 \times 10^{22} X + \alpha < Y < 1.01 \times 10^{22} X + \beta, \text{ where } \alpha = 4.9 \times 10^{21}, \beta = 5.9 \times 10^{21}; \quad (1)$$

and in said hydrogen bond concentration Y ($cm^{-3}$), the hydrogen-silicon bond concentration Z ($cm^{-3}$) satisfies the following formula with respect to said Si/N ratio X:

$$1.58 \times 10^{22} X - \delta < Z < 1.58 \times 10^{22} X - \delta, \text{ where } \gamma = 10.6 \times 10^{21}, \delta = 9.2 \times 10^{21} \quad (2)$$

wherein said hydrogen bond concentration (Y) and hydrogen-silicon bond concentration (Z) serve to reduce the internal stress of said protective film.

2. A device protecting film according to claim 1, wherein said Si/N ratio is not greater than 0.87.

3. A device protecting film according to claim 1, wherein said Si/N ratio is at least 0.75.

4. A device protecting film according to claim 2, wherein said Si/N ratio is at least 0.75.

5. A device protecting film according to claim 1, wherein said device is a semiconductor device.

6. A semiconductor device having said protecting film according to claim 1 formed on a semiconductor substrate having a semiconductor element formed thereon.

7. A semiconductor device according to claim 6, wherein said device protecting film is in direct contact with a metal wiring of said semiconductor element.

* * * * *